United States Patent [19]
Ueda

[11] Patent Number: 4,949,158
[45] Date of Patent: Aug. 14, 1990

[54] SEMICONDUCTOR DEVICE
[75] Inventor: Tetsuya Ueda, Itami, Japan
[73] Assignee: Mitsubishi Denki Kabushiki Kaisha, Japan
[21] Appl. No.: 217,975
[22] Filed: Jul. 12, 1988
[30] Foreign Application Priority Data
   Jul. 24, 1987 [JP] Japan .................. 62-185947
[51] Int. Cl.$^5$ .............. H01L 23/48; H01L 29/44; H01L 29/52; H01L 29/60
[52] U.S. Cl. .................. 357/68; 357/69; 357/70; 361/398; 361/408; 361/421
[58] Field of Search .............. 357/68, 69, 70; 361/398, 408, 421

[56] References Cited
U.S. PATENT DOCUMENTS

| | | | |
|---|---|---|---|
| 3,390,308 | 6/1968 | Marley | 357/69 |
| 3,684,818 | 8/1972 | Netherwood | 174/525 |
| 3,972,062 | 7/1976 | Hopp | 357/68 |
| 4,312,926 | 1/1982 | Burns | 428/571 |
| 4,538,210 | 8/1985 | Schaller | 361/401 |

FOREIGN PATENT DOCUMENTS

| | | |
|---|---|---|
| 51-112177 | 10/1976 | Japan. |
| 0048931 | 3/1983 | Japan ............ 357/69 |
| 0218130 | 12/1983 | Japan ............ 357/69 |
| 0142525 | 7/1985 | Japan ............ 357/69 |
| 0188333 | 8/1987 | Japan ............ 357/69 |

Primary Examiner—Rolf Hille
Assistant Examiner—David M. Ostrowski
Attorney, Agent, or Firm—Leydig, Voit & Mayer

[57] ABSTRACT

A semiconductor device provided with a film having an opening and first and second surfaces; a semiconductor chip having first and second surfaces corresponding to the first and second surfaces of the film and positioned inside the opening along the film; a plurality of first leads fixed to the first surface of the film, a tip of each first lead being electrically connected to a first electrode provided on the first surface of the semiconductor chip; at least one second lead fixed to the first surface of the film; an electroconductive member in the form of, e.g., a film, fixed to the second surface of the film and electrically connected to a second electrode provided on the second surface of the semiconductor chip; and a connection member passing through the film and electrically connecting the second lead and the electroconductive member to each other. The second electrode on the second surface of the semiconductor chip is connected to the second lead on the first surface of the film via the electroconductive member and the connection member. There is also provided a method of manufacturing this type of semiconductor device.

7 Claims, 8 Drawing Sheets

SEMICONDUCTOR DEVICE

BACKGROUND OF THE INVENTION

1. Field of the Invention

This invention relates to a semiconductor device formed by joining a semiconductor chip with a tape carrier and also to a method of manufacturing this type of semiconductor device.

2. Description of the Prior Art

A type of semiconductor device including a semiconductor chip mounted on a tape carrier has received considerable notice in the field of manufacturing semiconductor devices since it enables improvements in automation and speedup of the manufacturing process as well as in the performance of initial tests of the semiconductor chip.

In general, this type of conventional semiconductor device has a structure such as that shown in FIGS. 20 and 21. That is, a semiconductor device 1 includes a semiconductor chip 2 and a tape carrier 3 on which the semiconductor device 2 is mounted. The tape carrier 3 is formed of a film 4 made of, e.g., a polyimide synthetic resin, and leads 5 disposed on the surface of the film 4.

The film 4 has perforations 6 regularly disposed along its opposite sides, and a rectangular opening 7 formed at its center, and outer lead holes 8 formed around the periphery of the opening 7. The central opening 7 is usually called a center device hole. The tips of the leads 5 extend over the opening 7 as inner leads 5a. Central portions of the leads 5 are positioned above the outer lead holes 8 as outer leads 5b. The rear ends of the leads 5 are formed as test pads 5c. The leads 5 are supported by a support portion 9 defined between the opening 7 and the outer lead holes 8. A semiconductor chip 2 is connected to the inner leads 5a of the leads 5 through bumps 10 (FIG. 21).

A conventional process of manufacturing this type of semiconductor device will be described below.

The semiconductor chip 2 is first introduced into the opening 7 of the film 4, and the inner leads 5a are connected to the bumps 10 formed on electrodes disposed on one surface 2u of the semiconductor chip 2. Ordinarily, this connection is effected by connecting the semiconductor chip 2 and the tape carrier 3 to each other thermocompression bonding. In this state, connection tests and operational tests of the semiconductor chip 2 are performed using the test pads 5c. Thereafter, the leads 5 are cut between the outer leads 5b and the test pads 5c, and bridging portions 11 formed between adjacent outer lead holes 8 are also cut. The outer leads 5b are then connected to a circuit board or the like, thereby enabling the semiconductor device to be used.

Thus, in the conventional semiconductor device, only the electrodes formed on one surface of the semiconductor chip 2 are connected to the leads 5 through the bumps 10. However, as semiconductor chips are developed in many variations, the need arises for a type of semiconductor chip, which includes electrodes on both the obverse and reverse sides. In this case, it is difficult to apply TAB (Tape Automated Bonding) technology, i.e. it is necessary to first connect electrodes on one side of the semiconductor chip 2 to the leads 5 and thereafter connect electrodes on the other surface of the chip 2 with desired leads 5 by wire bonding. As a result, this operation reduces the advantages of semiconductor device manufacturing using a tape carrier, i.e., automation and speedup of manufacture.

SUMMARY OF THE INVENTION

The present invention has been achieved with a view to solving these problems, and an object of the present invention is to provide a semiconductor device which can be manufactured without performing wire bonding while but employing electrodes on both the obverse and reverse sides of the semiconductor chip.

Another object of the present invention is to provide a method of manufacturing this type of semiconductor device.

In accordance with these and other objects, the present invention provides a semiconductor device including:

a film having an opening and first and second surfaces;

a semiconductor chip positioned in the opening along the film, the semiconductor chip having first and second surfaces respectively corresponding to the first and second surfaces of the film;

at least one first lead fixed to the first surface of the film, the tip of the first lead being electrically connected to a first electrode on the first surface of the semiconductor chip;

at least one second lead fixed to the first surface of the film;

an electrically conductive member fixed to the second surface of the film and electrically connected to a second electrode on the second surface of the semiconductor chip; and a connection means passing through the film and electrically connecting the second lead and the electrically conductive member to each other.

In accordance with the present invention, the second electrode formed on the second surface of the semiconductor chip is electrically connected to the second lead fixed to the first surface of the film via the electrically conductive member and the connection means passing through the film.

The present invention also provides a method of manufacturing a semiconductor device of the above structure, including the steps of:

forming a connection means having an electroconductive property in the vicinity of an opening formed in a first film having first and second surfaces so that the connection means passes through the first film;

fixing at least one first lead to the first surface of the film so that the tip of the first lead projects over the opening;

fixing at least one second lead to the first surface of the first film while electrically connecting the second lead to one end of the connection means;

introducing a semiconductor chip having first and second surfaces corresponding to the first and second surfaces of the first film into the opening of the first film;

electrically connecting a first electrode formed on the first surface of the semiconductor chip to the first lead projecting over the opening of the first film;

positioning a second film having an electrically conductive member relative to the second surface of the first film; and electrically connecting the electrically conductive member to a second electrode formed on the second surface of the semiconductor chip and to the other end of the connection means.

DESCRIPTION OF THE PREFERRED EMBODIMENTS

Figure 1:
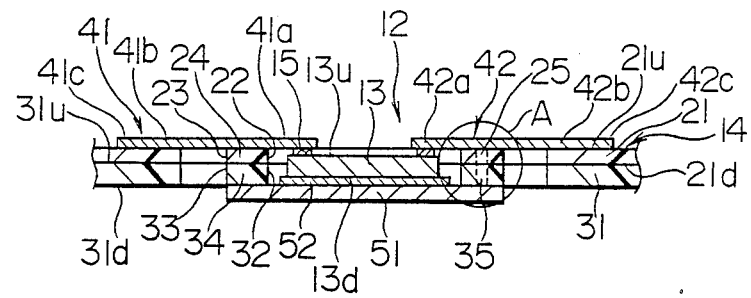
FIG. 1 is a cross-sectional view of a first embodiment of the present invention.

Referring to FIG. 1, a semiconductor device 12 includes a semiconductor chip 13 and a tape carrier 14 on which the semiconductor device 13 is mounted. The tape carrier 14 is formed of a first film 21 and a second film 31. This first film 21 is made of, e.g., a polyimide synthetic resin, and has a rectangular opening 22 formed at its center, and outer lead holes 23 formed around the periphery of the opening 22. First and second leads 41 and 42 are disposed on a first surface of the first film 21. The tips of the leads 41 and 42 extend over the opening 22 as inner leads 41a and 42a. The leads 41 and 42 have central portions 41b and 42b positioned above the outer lead holes 23 as outer leads, and rear ends 41c and 42c formed as test pads. A connection means 25 is formed in a support portion 24 between the opening 22 and the outer lead holes 23 of the first film 21. The connection means 25 has a through hole which extends from the first surface 21u to a second surface 21d of the first film 21. The inner wall of the through hole 25 formed in the first film is coated with an electrically conductive material such as a metal. The second lead 42 is electrically connected to an end of the connection means 25.

A semiconductor chip 13 is positioned inside the opening 22 of the first film 21. The semiconductor chip 13 has a plurality of first electrodes formed on its first surface 13u, and a second electrode formed on its second surface 13d. Bumps 15 are formed on the first electrodes and are connected to the inner leads 41a and 42a.

A second film 31 formed from, e.g., polyimide, has a first surface 31u attached to the second surface 21d of the first film 21. The second film 31 has an opening 32 and outer lead holes 33. The positions and the sizes of the opening 32 and the holes 33 are the same as those of the opening 22 and the outer lead holes 23 of the first film 21. The second film 31 also has a connection means 35 which is formed in a support portion 34 defined between the opening 32 and the outer lead holes 33. The position and the construction of the connection means 35 correspond to those of the connection means 25 formed in the first film 21.

Figure 2:
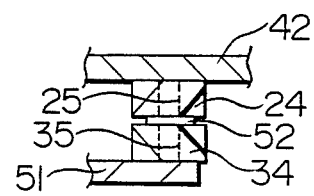
FIG. 2 is an enlarged cross-sectional view of a portion of the embodiment shown in FIG. 1.

An electrically conductive foil 51 made of, e.g., a metal, is disposed on a second surface 31d of the second film 31. The electrically conductive foil 51 is connected at its peripheral portion to the support portion 34 of the second film 31. A central portion of the electrically conductive foil 51 is connected to the second surface 13d and the second electrode of the semiconductor chip 13 using an electrically conductive adhesive 52 or solder. The opening 32 of the second film 31 is closed by the electrically conductive foil 51. As shown in FIG. 2, the other end of the connection means 25 of the first film 21 is electrically connected to one end of the connection means 35 of the second film 31 by the electrically conductive adhesive 52. The other end of the connection means 35 of the second film 31 is electrically connected to the electrically conductive foil 51.

That is, in this semiconductor device, the second electrode formed on the second surface 13d of the semiconductor chip 13 is electrically connected to the second lead 42 formed on the first surface 21u of the first film 21 via the electrically conductive adhesive 52, electrically conductive foil 51 and two connection means 25 and 35.

Next, a method of manufacturing a semiconductor device of the above-described structure will be described below.

Figure 3:
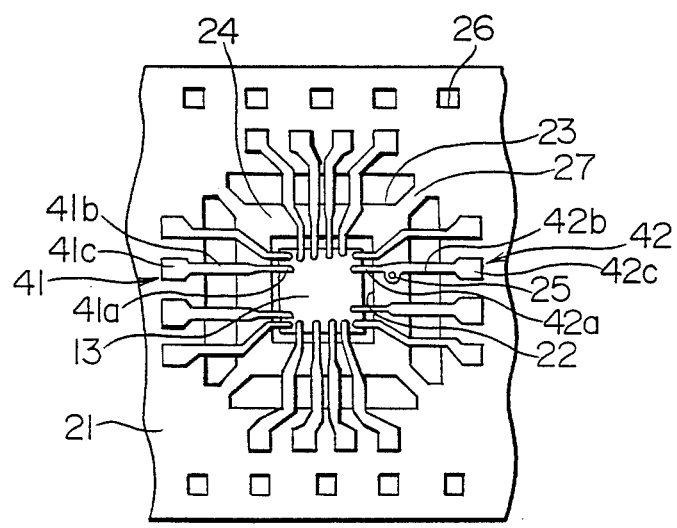
FIGS. 3 to 5 are diagrams of the process of manufacturing the semiconductor device shown in FIG. 1.

As shown in FIG. 3, the first film 21 is provided with perforations 26 regularly arranged along its opposite sides, the opening 22 formed at its center, and the outer lead holes 23 formed around the periphery of the opening 22. A through hole is formed in the support portion 24 of the first film 21 extending from the first surface 21u to the second surface 21d. The inner wall of this hole is coated with an electrically conductive material, thus forming the connection means 25.

Thereafter, a necessary number of first leads 41 are fixed to the first surface of the first film 21. The first leads 41 are supported by the support portion 24 between the opening 22 and the outer lead holes 23, and their tips extend over the opening 22 as inner leads 41a.

Similarly, one second lead 42 is fixed to the surface 21u of the first film 21 above the through hole 25. That is, the second lead 42 is supported by the support portion 24 while its tip extends over the opening 22 as an inner lead 42a. The second lead 42 is electrically connected to one end of the connection means 25.

The semiconductor chip 13 is then introduced into the opening 22 of the first film 21. At this time, the semiconductor chip 13 is positioned in such a manner that the first and second surfaces 13u and 13d are respectively parallel to the first and second surfaces 21u and 21d of the first film 21. Thereafter, the bumps 15 formed on the first electrodes on the first surface 13u of the semiconductor chip 13 are connected to the inner leads 41a of the first leads 41 and the inner lead 42a of the second lead 42. In this state, the connections and the operation of the semiconductor chip 13 are tested by using the test pads 41c and 42c of the leads 41 and 42.

Figure 4:
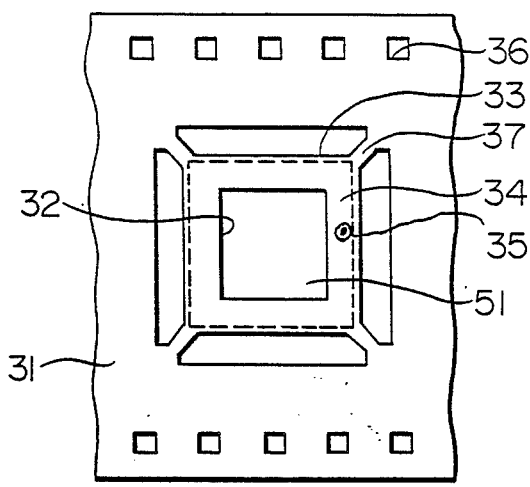

As shown in FIG. 4, the second film 31 is formed such that it has substantially the same size and configuration as those of the first film 21. That is, the second film 31 is provided with perforations 36 regularly arranged along its opposite sides, the opening 32 formed at its center, and the outer lead holes 33 formed around the periphery of the opening 32. A through hole is formed in the support portion 34 of the second film 31 in a position corresponding to that of the connection means 25 of the first film 21 extending from the first surface 31u to the second surface 31d. The inner wall of this hole is coated with an electrically conductive material, thus forming the connection means 35.

Thereafter, the electrically conductive foil 51 is positioned on the second surface 31d of the second film 31 such that it closes the opening 32. A peripheral portion of the electrically conductive foil 51 is connected to the support portion 34. At this time, the other end of the through hole 35 and the electrically conductive foil 51 are electrically connected.

Figure 5:
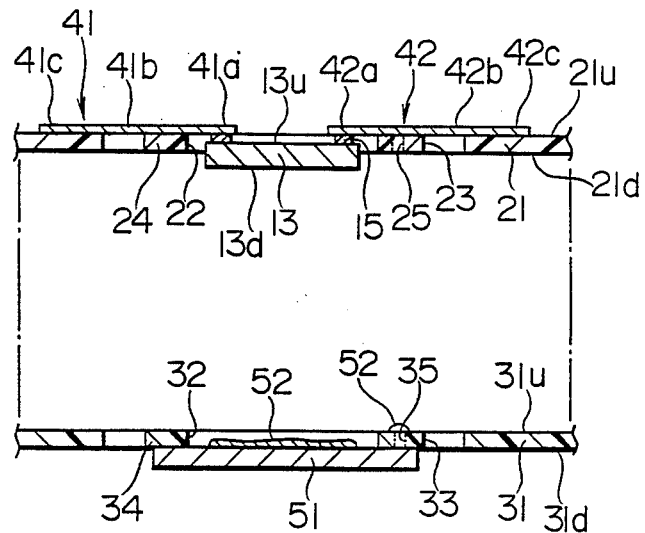

As shown in FIG. 5, the electrically conductive adhesive 52 is applied to the surface of the electrically conductive foil 51 inside the opening 32 of the second film 31. The electrically conductive adhesive 52 is also applied to the end of the through hole 35 of the second film 31. The first and second films 21 and 31 are thereafter positioned such that the openings 22 and 32 thereof coincide with each other and that the connection means 25 and 35 also coincide with each other. The second surface 13d of the semiconductor chip 13 is then attached to the surface of the foil 51 to which the adhesive has been applied. At the same time, the second surface 21d of the first film 21 and the first surface 31u of the second film 31 are attached to each other. The connection means 25 and 35 are thereby electrically connected to each other.

Thereafter, the leads 41 and 42 are cut between the outer leads 41b and 42b and the test pads 41c and 42c, and the bridging portions 27 and 37 positioned between the adjacent outer lead holes 23 and 33 of the first and second films 21 and 31 are also cut, thereby enabling the use of the semiconductor device.

In the described embodiment, the inner lead 42a of the second lead 42 that is electrically connected to the second electrode of the semiconductor chip 13 via the connection means 25 and 35 and the electrically conductive foil 51 is also connected to the corresponding f electrode of the semiconductor chip 13. However, the need for connecting the second lead 42 to the first electrode of the semiconductor chip 13 depends upon the arrangement of the circuit formed therein, and this connection is not always established.

Figure 6:
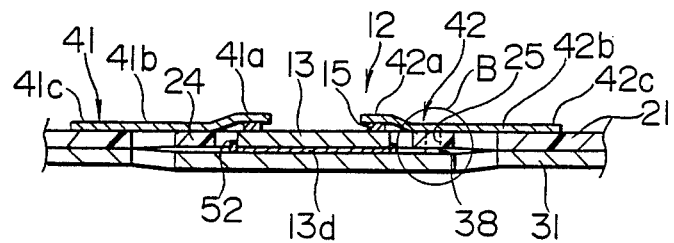
FIG. 6 is a cross-sectional view of a second embodiment of the present invention.

If the second film 31 is formed from a highly electrically conductive material such as a metal, the second film 31 itself can be used as an electrically conductive member, as shown in FIG. 6, instead of connecting the electrically conductive foil to the second film. In this case, the second surface 13d of the semiconductor chip 13 is directly attached to the second film 31.

Figure 7:
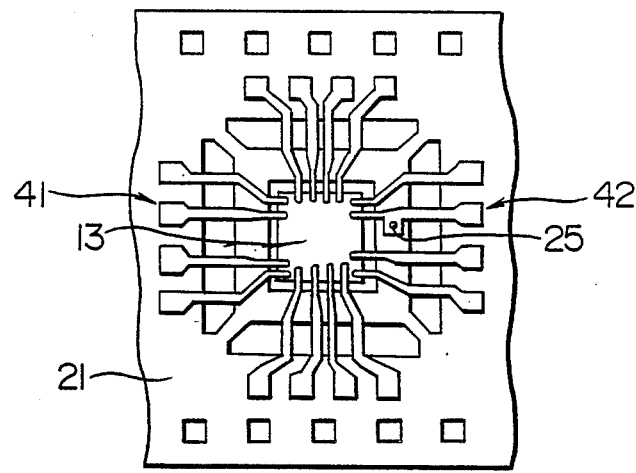
FIGS. 7 to 9 are diagrams of the process of manufacturing the semiconductor device shown in FIG. 6.
Figure 8:
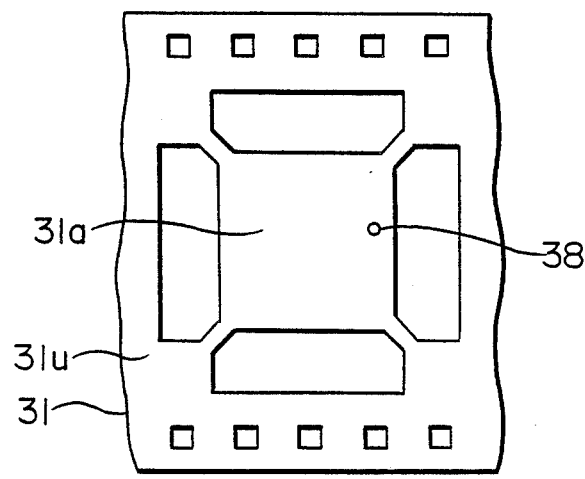
Figure 9:
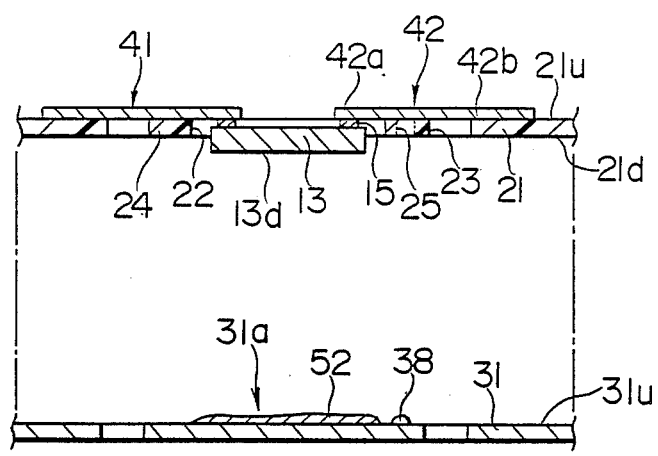
Figure 10:
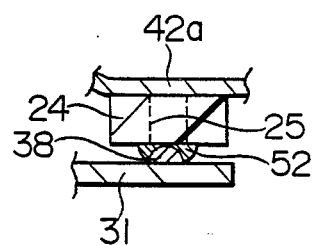
FIG. 10 is an enlarged cross-sectional view of a portion of the embodiment shown in FIG. 6.

As shown in FIG. 7, the semiconductor chip 13 is mounted on the first film 21 in a manner similar to that shown in FIG. 3 while a central portion 31a of the second film 31 is not formed with an opening as shown in FIG. 8 and is used as an electrically conductive member. A conductive projection 38 is formed on the first surface 31u of the second film 31 in a position corresponding to the connection means 25 of the first film 21. The electrically conductive adhesive 52 is applied to the central portion 31a and to the projection 38 of the second film 31. Thereafter, the first and second films can be attached to each other while the second surface 13d of the semiconductor chip 13 is connected to the central portion 31a (see FIG. 9). At this time, the connection means 25 of the first film 21 is electrically connected to the projection 38 formed on the second film 31, as shown in FIG. 10.

The projection 38 is provided for the purpose of facilitating the connection between the connection means 25 of the first film 21 and the second film 31 and, therefore, it is not always necessary.

If the thickness of the semiconductor chip 13 is greater than that of the first film 21, it is necessary to bend the inner leads 41a and 42a of the leads 41 and 42, as shown in FIG. 6, in order to allow these leads to be connected to the bumps 15 on the semiconductor chip 13, since the second film 31 is attached to the second surface 13d of the semiconductor chip 13 and to the second surface 21d of the first film 21.

Figure 11:
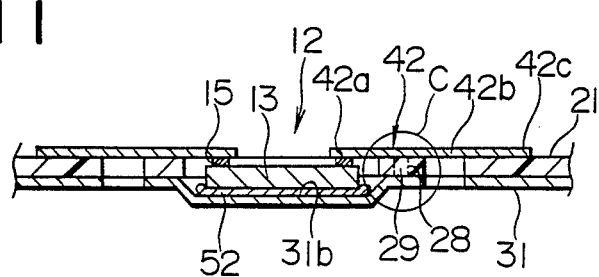
FIG. 11 is a cross-sectional view of a third embodiment of the present invention.

To avoid this difficulty, a recess 31b for receiving the semiconductor chip 13 may be formed in the second film 31 having an electrically conductive property, as shown in FIG. 11, thereby enabling the leads 41 and 42 to be connected to the bumps 15 on the semiconductor chip 13 without being bent. This method ensures that the possibility of breakage of the leads 41 and 42 or the possibility of detachment of the bumps is reduced, thereby improving the reliability of lead connection.

Figure 12:
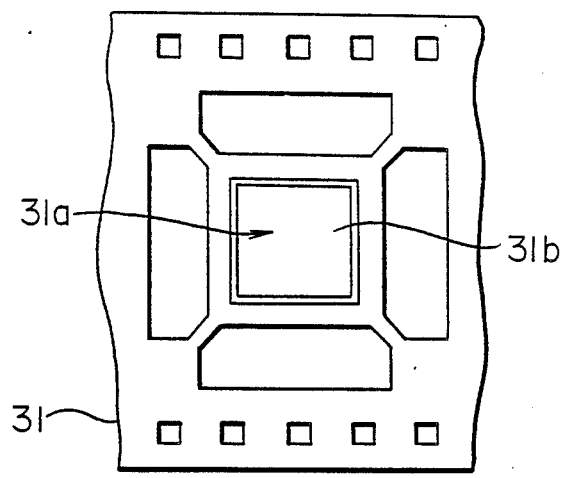
FIGS. 12 and 13 are diagrams of the process of manufacturing the semiconductor device shown in FIG. 11.
Figure 13:
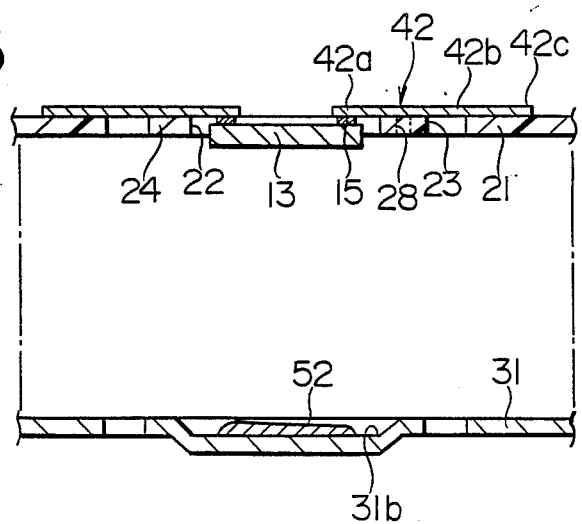

In this case, the semiconductor chip 13 is connected to the first film 21 in a manner similar to that illustrated in FIG. 3 while the central portion 31a is formed with the recess 31b as shown in FIG. 12 in place of the opening where the semiconductor chip 13 is received. The electrically conductive adhesive 52 is applied to the surface of the recess 31b in the second film 31, and the first film 21 and the second film 31 are attached to each other while the second surface 13d of the semiconductor chip 13 is connected to the recess 31b (see FIG. 13).

Figure 14:
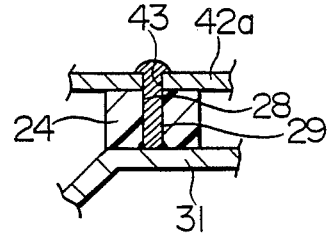
FIG. 14 is an enlarged cross-sectional view of a portion of the embodiment shown in FIG. 11.

In this embodiment, a through hole 28 is formed in the support portion 24 of the first film 21 in place of the connection means 25 such that it extends from the first surface 21u to the second surface 21d, as shown in FIG. 14. Also, in the second lead 42 connected to the support portion 24, a hole 43 is formed directly above the through hole 28. After the first and second films 21 and 31 have been attached to each other the interiors of the holes 28 and 43 are filled with an electrically conductive material 29 from above the second lead 42, thereby forming a means for electrically connecting the second lead 42 and the second film 31. The electrically conductive material may be an electrically conductive adhesive or solder.

The use of such a connection means enables an electrical connection to be established by very simple processing, and simplifies the manufacturing process as well as reducing costs. Needless to say, a through hole equivalent to that of first or second embodiment may be used.

Figure 15:
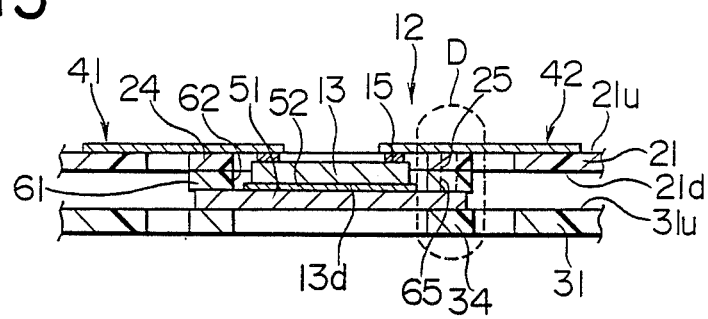
FIG. 15 is a cross-sectional view of a fourth embodiment of the present invention.

In an embodiment shown in FIG. 15, the electrically conductive foil 51 is formed on the first surface 31u of the second film 31, and is attached to the second surface 13d of the semiconductor chip 13. A thickness adjusting spacer 61 is disposed between the electrically conductive foil 51 and the support portion 24 of the first film 21 in order that the leads 41 and 42 can be connected to the bumps 15 of the semiconductor chip 13 without being bent. The spacer 61 has an opening 62 of the same size and configuration as the opening 22 of the first film 21, and a connection means 65 which is formed at the same position and with the same structure as the connection means 25.

Figure 16:
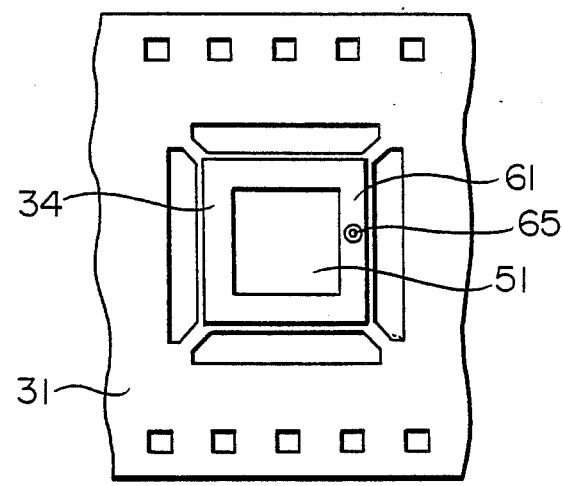
FIGS. 16 and 17 are diagrams of the process of manufacturing the semiconductor device shown in FIG. 15.
Figure 17:
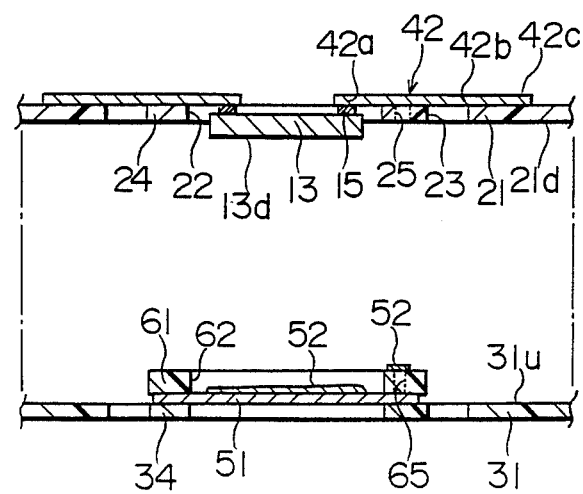

In this case, the semiconductor chip 13 is mounted on the first film 21 in a manner similar to that illustrated in FIG. 3 while the electrically conductive foil 51 is, as shown in FIG. 16, connected to the support portion 34 of the second film 31 on the side of the surface 31u. Thereafter, the spacer 61 is positioned above and connected to the electrically conductive foil 51. The electrically conductive adhesive 52 is applied to the surface of the electrically conductive foil 51 inside the opening 62 and over the through hole 65, and the second surface 13d of the semiconductor chip 13 is attached to the electrically conductive foil 51 while the spacer 61 is connected to the support portion 24 of the first film 21 on the side of the surface 21d (see FIG. 17). Electrical connection is thereby established between the connection means 25 of the first film 21 and the connection means 65 of the spacer 61.

Figure 18:
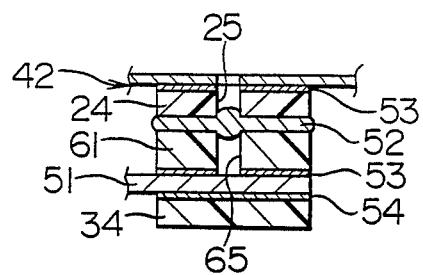
FIG. 18 is an enlarged cross-sectional view of a portion of the embodiment shown in FIG. 15.

As, shown in FIG. 18, the first film 21 and the second lead 42, as well as the electrically conductive foil 51 and the spacer 61, are connected to by a second adhesive 53 which is an epoxy resin or the like and which is used in an ordinary tape carrier manufacturing process. On the other hand, the second film 31 and the electrically conductive are connected to each other by a third adhesive 54 which has a glass transition temperature lower than the glass transition temperatures or melting points of the first and second adhesives 52 and 53.

Figure 19:
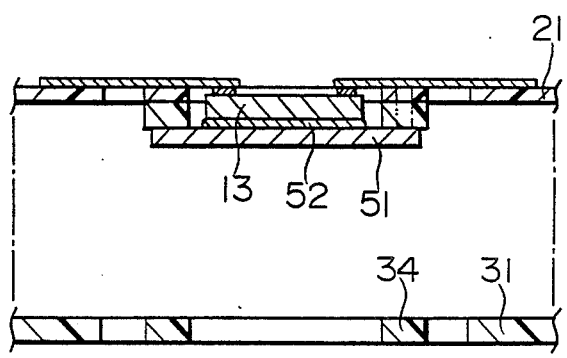
FIG. 19 is a cross-sectional view of the fourth embodiment in which a second film is separated.
Figure 20:
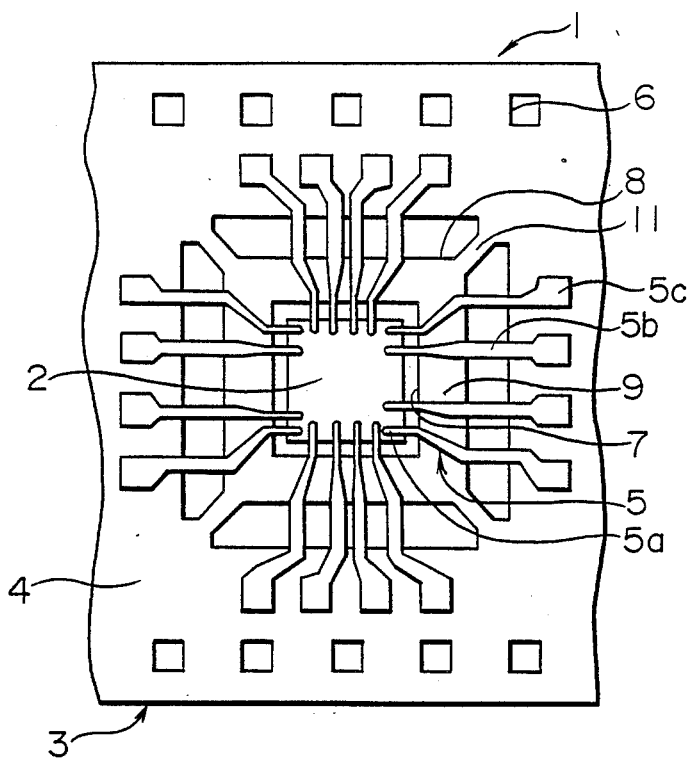
FIGS. 20 and 21 are plan and cross-sectional views of a conventional semiconductor device.
Figure 21:
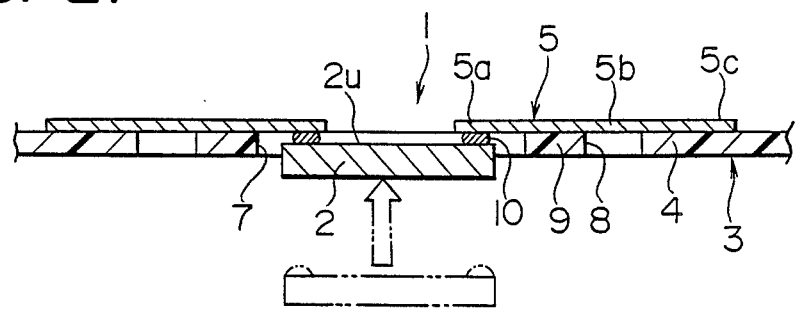

After the first film 21 and the spacer 61, as well as the semiconductor chip 13 and the electrically conductive foil 51, have been connected to each other, the semiconductor device 12 is maintained at a temperature higher than the glass transition temperature of the third adhesive 54 and lower than the glass transition temperatures of the first and second adhesives 52 and 53. Then, the first and second adhesives exhibit a high adhesive power but the adhesive power of the third adhesive is markedly lowered. In consequence, the second film 31 can be easily separated from the electrically conductive and detached foil 51 by being pulled therefrom, as shown in FIG. 19.

This method ensures that the tape carrier 14 on which the semiconductor chip 13 is supported can be only one sheet of the first film 21. Therefore, if a multiplicity of semiconductor chips 13 are successively mounted on an elongated tape carrier 14, the tape carrier 14 can be readily wound around a reel, thereby facilitating the handling of the semiconductor devices.

If a solder is used instead of the first adhesive 52, the semiconductor device 12 may be maintained at a temperature higher than the glass transition temperature of the third adhesive 54 and lower than the glass transition temperature of the second adhesive 53 and the melting point of the solder.

The electrical conducting means may be of a type obtained by coating the surface of the second film 31, a synthetic resin or the like, with an electrically conductive material to form a thin film.

What is claimed is:

1. A semiconductor device comprising:
   an electrically insulating film having an opening and first and second surfaces;
   a semiconductor chip positioned in said opening, said semiconductor chip having first and second surfaces respectively generally parallel to said first and second surfaces of said electrically insulating film and first and second electrodes disposed on said first and second surfaces of said semiconductor chip, respectively;
   at least one first lead mounted on said first surface of said electrically insulating film, said first lead being electrically connected to said first electrode;
   at least one second lead mounted on said first surface of said electrically insulating film;
   an electrically conductive member mounted on said second surface of said electrically insulating film mechanically and electrically connected to said second electrode at the second side of the insulating film; and
   connection means passing through said electrically insulating film electrically connecting said second lead with said electrically conductive member whereby electrical access to said first and second electrodes is provided at said first surface of said electrically insulating film.

2. A semiconductor device according to claim 1 wherein said electrically conductive member is an electrically conductive film.

3. A semiconductor device according to claim 2 wherein said electrically conductive member is an electrically conductive foil.

4. A semiconductor device according to claim 2 wherein said electrically conductive member covers said opening of said electrically insulating film.

5. A semiconductor device according to claim 4 wherein said electrically conductive member has a recess for accommodating said semiconductor chip to make said first surface of said semiconductor chip and said first surface of said electrically insulating film essentially coplanar.

6. A semiconductor device according to claim 1 wherein said connection means includes a coating on the inner wall of a through hole in said electrically insulating film.

7. A semiconductor device according to claim 1 wherein said connection means includes an electrically conductive material disposed in a through hole in said electrically insulating film.

* * * * *